(12) United States Patent
Shappir et al.

(10) Patent No.: US 6,700,818 B2
(45) Date of Patent: Mar. 2, 2004

(54) METHOD FOR OPERATING A MEMORY DEVICE

(75) Inventors: Assaf Shappir, Modein (IL); Dror Avni, Haifa (IL); Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 10/211,248

(22) Filed: Aug. 5, 2002

(65) Prior Publication Data

US 2003/0156456 A1 Aug. 21, 2003

Related U.S. Application Data

(60) Provisional application No. 60/352,549, filed on Jan. 31, 2002.

(51) Int. Cl.[7] ............................................. G11C 16/04
(52) U.S. Cl. ........................ 365/185.19; 365/185.28; 365/185.29
(58) Field of Search ................. 365/185.21, 185.22, 365/185.24, 185.28, 185.29, 185.19

(56) References Cited

U.S. PATENT DOCUMENTS

| | | | | |
|---|---|---|---|---|
| 5,677,869 A | * | 10/1997 | Fazio et al. | 365/185.03 |
| 5,751,637 A | * | 5/1998 | Chen et al. | 365/185.33 |
| 6,011,725 A | | 1/2000 | Eitan | |
| 6,330,192 B1 | * | 12/2001 | Ohba et al. | 365/185.3 |
| 6,343,033 B1 | * | 1/2002 | Parker | 365/185.19 |
| 6,426,898 B1 | * | 7/2002 | Mihnea et al. | 365/185.3 |

OTHER PUBLICATIONS

Avni et al., U.S. Patent Application Ser. No. 09/730,586, filed Dec. 7, 2000.

* cited by examiner

*Primary Examiner*—Son Mai
(74) *Attorney, Agent, or Firm*—Eitan, Pearl, Latzer & Cohen Zedek, LLP

(57) ABSTRACT

A method for operating bits of memory cells in a memory array, the method including applying operating pulses to bits of a sample of memory cells, determining a response of at least one of an electrical, physical and mechanical property (e.g., threshold voltage) of the bits to the operating pulses, and applying at least one further operating pulse to the rest of the array, the at least one further operating pulse being a function of the response.

9 Claims, 3 Drawing Sheets

METHOD FOR OPERATING A MEMORY DEVICE

CROSS-REFERENCE TO RELATED APPLICATIONS

The present application claims priority from U.S. provisional application Ser. No. 60/352,549, filed Jan. 31, 2002, which is hereby incorporated by reference in its entirety.

FIELD OF THE INVENTION

The present invention relates generally to operating memory cells of non-volatile memory (NVM) arrays, such as programming and erasing, and particularly to methods for reducing pulse operations of such arrays.

BACKGROUND OF THE INVENTION

Memory cells are used in the implementation of many types of electronic devices and integrated circuits, such as, but not limited to, erasable, programmable read only memories (EPROMs), electrically erasable, programmable read only memories (EEPROMs), and flash EEPROM memories. Memory cells are used to store the data and other information for these and other integrated circuits.

Non-volatile memory (NVM) cells generally comprise transistors with programmable threshold voltages. For example, a floating gate transistor or a split gate transistor has a threshold voltage (Vt) that is programmed or erased by charging or discharging a floating gate located between a control gate and a channel in the transistor. Data is written in such memory cells by charging or discharging the floating gates of the memory cells to achieve threshold voltages corresponding to the data.

The act of programming the cell involves charging the floating gate with electrons, which increases the threshold voltage Vt. The act of erasing the cell involves removing electrons from the floating gate, which decreases the threshold voltage Vt.

One type of non-volatile cell is a nitride, read only memory (NROM) cell, described in U.S. Pat. No. 6,011,725, the disclosure of which is incorporated herein by reference. Programming and erasing of NROM cells are also described in U.S. Pat. No. 6,011,725.

Unlike a floating gate cell, the NROM cell has two separated and separately chargeable areas. Each chargeable area defines one bit The separately chargeable areas are found within a nitride layer formed in an oxide-nitride-oxide (ONO) stack underneath the gate. When programming a bit, channel hot electrons are injected into the nitride layer. This is generally accomplished by the application of a positive gate voltage and positive drain voltage, the magnitude and duration of which are determined by different factors related to the amount of programming required.

One preferred procedure for programming bits in NROM cells with programming pulses is described in Applicant's copending U.S. patent application Ser. No. 09/730,586, entitled "Programming And Erasing Methods For An NROM Array", the disclosure of which is incorporated herein by reference.

The application of pulses to operate (program or erase) the NROM array may pose a problem for mass storage or code flash applications. For example, in programming a mass storage array, a major requirement is a fast programming rate, in the range of at least 2 MB/sec. The channel hot electron injection (CHE) used for programming may require a relatively high programming current, e.g., approximately 100μA per cell. In addition, each programming step may comprise switching and subsequent verification steps. These factors may limit the amount of cells that may be programmed in parallel, to about 64 cells, for example.

Other complications that may hinder achieving fast, parallel programming rates include, among others, temperature dependence, cell length dependence (e.g., die to die and within a die), neighboring cell state dependence, second bit state dependence, and others. For example, FIG. 1 illustrates an effect of cell length on programming NROM cells. FIG. 1 illustrates the change in threshold voltage as a function of drain voltage used to program the cell. In the illustrated example, a first graph, denoted by the reference numeral 77, shows the change in threshold voltage as a function of drain voltage for a cell with a length of 0.5 microns. A second graph, denoted by the reference numeral 78, shows the change in threshold voltage as a function of drain voltage (Vd) for a cell with a length of 0.55 microns. It is seen that the slightly longer cell requires a higher drain voltage to achieve the same change in threshold voltage as the shorter cell.

As another example, FIG. 2 illustrates an effect of temperature on programming NROM cells. FIG. 2 illustrates the change in threshold voltage as a function of drain voltage (Vd) used to program the cell. In the illustrated example, a first graph, denoted by the reference numeral 79, shows the change in threshold voltage as a function of drain voltage in an ambient of 20° C. A second graph, denoted by the reference numeral 80, shows the change in threshold voltage as a function of drain voltage in an ambient of 85° C. It is seen that the warmer ambient requires a higher drain voltage to achieve the same change in threshold voltage as the cooler ambient.

Determination of programming pulses is also complicated by the fact that the cell parameters and operating conditions are usually initially unknown. Utilizing large programming pulse steps may reduce the total amount of programming pulses required to program the array. However, this may be disadvantageous because it may result in a wide and varied distribution of threshold voltages in the programmed cells of the array, which may reduce product reliability.

Alternatively, accurate verification of the cell threshold voltage and comparison of the threshold voltage to a variety of references may reduce the amount of programming pulses and provide faster convergence to the desired programmed threshold voltage level. However, such a method may incur a substantial overhead in the form of multiple verify pulses (e.g., one per reference), which is an undesirable time penalty, or may require an intricate parallel reference design, which is an undesirable chip area penalty.

SUMMARY OF THE INVENTION

The present invention seeks to provide methods for operating (programming or erasing) bits of memory cells in memory arrays, and for reducing pulse operations of such arrays. The invention is described in detail hereinbelow with reference to memory cells of NVM arrays, and particularly to NROM cells, wherein programming and erasing generally involve changing the threshold voltage level of a bit. However, it should be emphasized that the invention is not limited to NVM arrays, nor to changing the threshold voltage levels of bits. Rather, the present invention is applicable for any non-volatile or volatile memory array whose operation is based on changing any kind of electrical, physical and/or mechanical properties of the cell array. The invention may be implemented in a variety of applications, such as but not limited to, mass storage or code flash applications, for example.

In accordance with a preferred embodiment of the present invention, a small amount of cells in the array may be sampled to determine their behavior characteristics upon the application of pulses to program or erase. After learning how the threshold voltage changes in accordance with the pulses, the rest of the array may be programmed (or erased) en masse with a significantly reduced number of pulses and verifies. In some cases, the rest of the array may be programmed (or erased) with just one pulse.

There is thus provided in accordance with a preferred embodiment of the invention a method for operating bits of memory cells in a memory array, the method including applying operating pulses to bits of a sample of memory cells, determining a response of at least one of an electrical, physical and mechanical property (e.g., threshold voltage) of the bits to the operating pulses, and applying at least one further operating pulse to the rest of the array, the at least one further operating pulse being a function of the response.

In accordance with a preferred embodiment of the invention the method determines an operating pulse that singly changes the at least one of an electrical, physical and mechanical property of the bits a predefined amount.

Further in accordance with a preferred embodiment of the invention the method determines a programming pulse that singly increases the at least one of an electrical, physical and mechanical property of the bits a predefined amount.

Still further in accordance with a preferred embodiment of the invention the method determines an erasing pulse that singly lowers the at least one of an electrical, physical and mechanical property of the bits a predefined amount.

Additionally in accordance with a preferred embodiment of the invention the method includes applying the operating pulse (which may be modified by a tolerance) that singly changes the at least one of an electrical, physical and mechanical property of the bits the predefined amount.

In accordance with a preferred embodiment of the invention the method includes, after applying the at least one further operating pulse to the rest of the array, verifying the at least one of an electrical, physical and mechanical property of bits of the array to determine if the at least one of an electrical, physical and mechanical property has reached a predefined level. If the at least one of an electrical, physical and mechanical property of at least a portion of the bits has not yet reached the predefined level, then at least one more operating pulse may be applied to the at least a portion of the bits.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
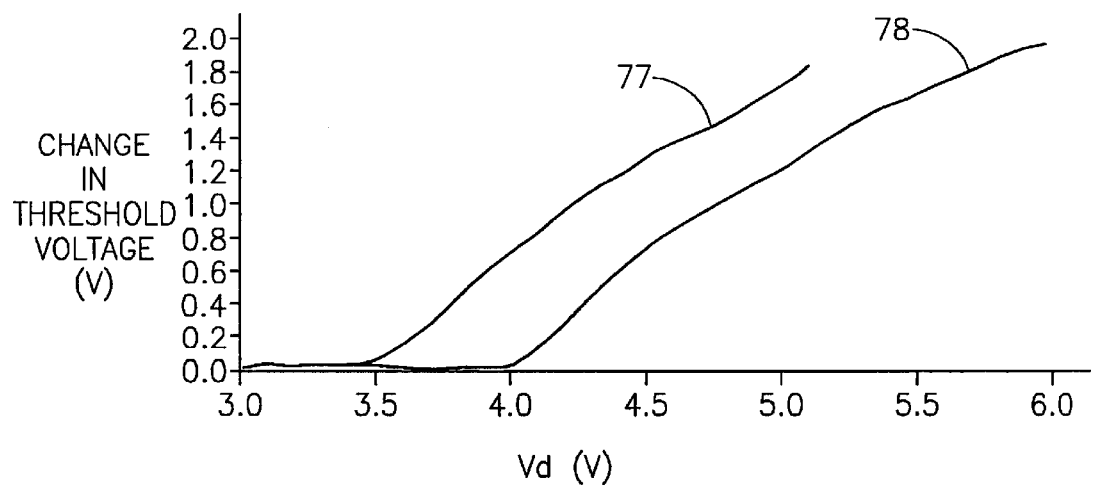
FIG. 1 is a simplified graph of an effect of cell length on programming speed for two different cell lengths.
Figure 2:
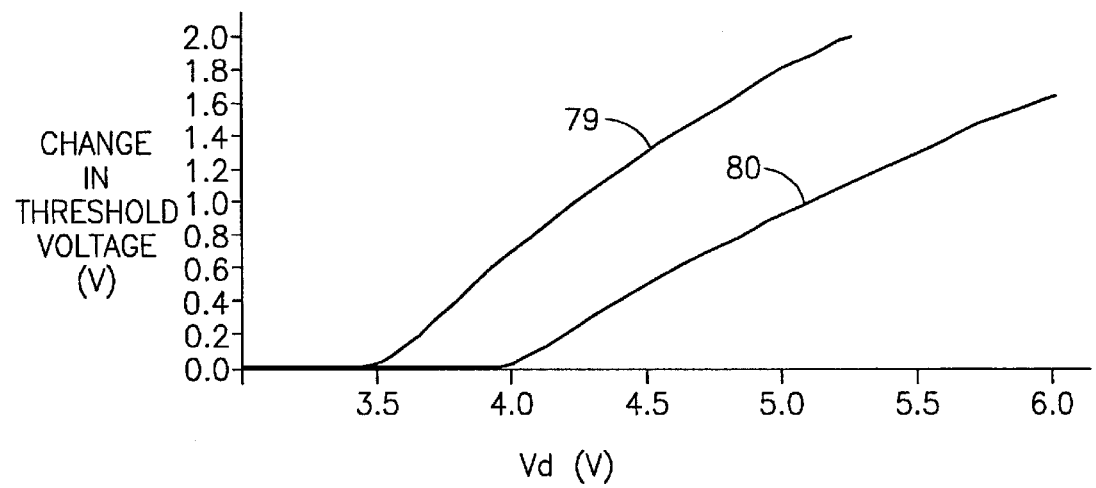
FIG. 2 is a simplified graph of an effect of temperature on programming speed for two different ambient temperatures.
Figure 3:
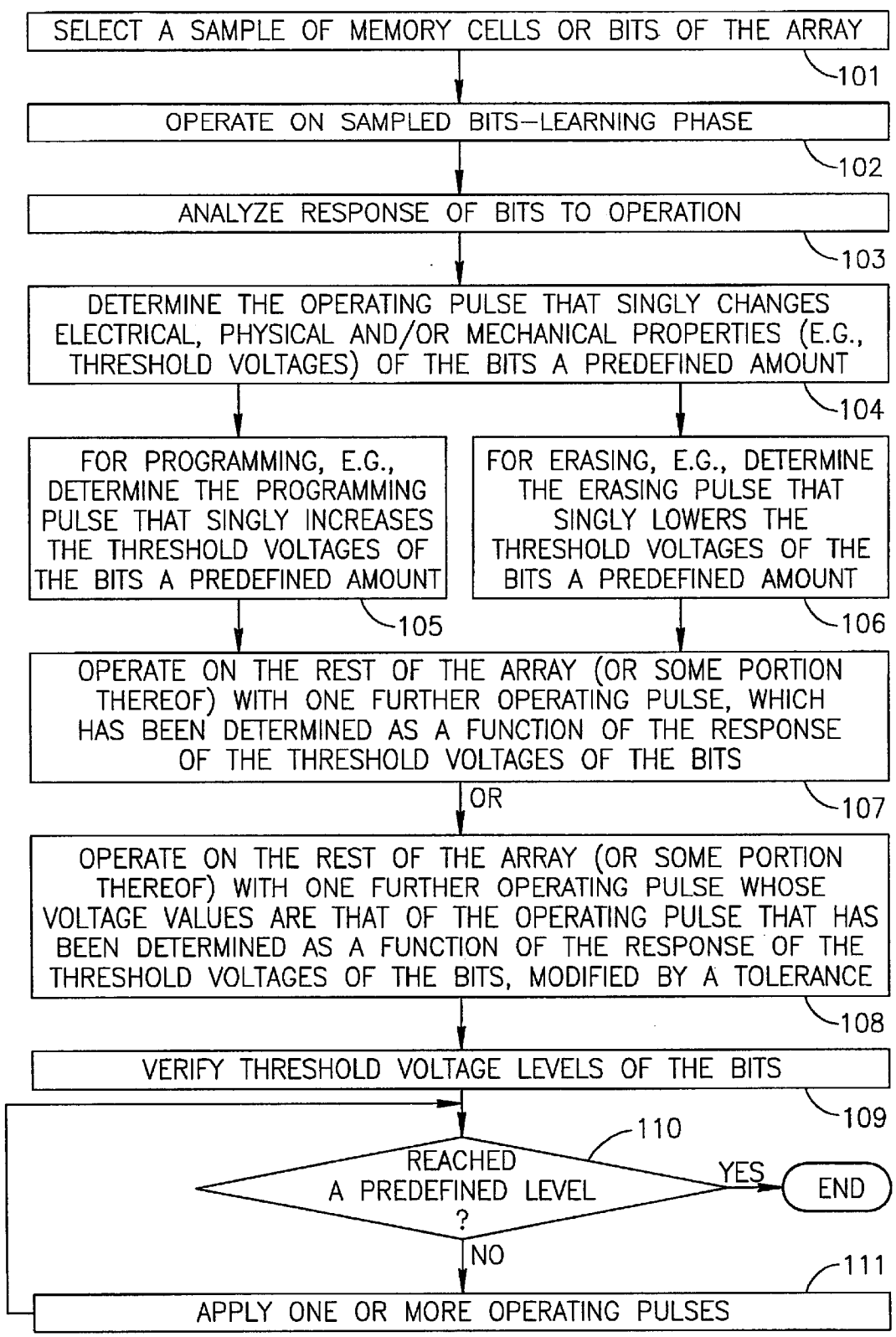
FIG. 3 is a flow chart of a method for operating (e.g., programming or erasing) bits of memory cells in a non-volatile memory cell array, in accordance with a preferred embodiment of the present invention.

Reference is now made to FIG. 3, which illustrates a method for operating bits of memory cells in a memory cell array, in accordance with a preferred embodiment of the present invention. FIG. 3 is shown and described herein for programming the bits, but it is appreciated that the invention is not limited to the operation of programming, and the invention may be applied to other operations, such as but not limited to, erasing.

A sample of memory cells or bits of the array may be selected (step 101). The sample size may be any arbitrary size, such as but not limited to, 64 cells, for example. Sampled bits may then be programmed (step 102), such as by using a stepped programming algorithm. A suitable stepped programming algorithm is the one described in the Applicant's abovementioned copending U.S. patent application Ser. No. 09/730,586, entitled "Programming And Erasing Methods For An NROM Array". The method comprises applying progressive pulses or steps of programing voltages that progressively raise the threshold voltages of the bits to the desired programmed level. The number of programming pulses or steps may comprise any number, such as but not limited to, 8 steps, and may comprise different gate and drain voltages (source may be grounded), respectively applied to word lines and bit lines of the array. The voltages may be applied for different durations of time as well during the stepped algorithm. The application of the stepped programming algorithm on the sample of bits is referred to as the learning phase, wherein the response nature of the bits to the programming voltages may be learned and perhaps stored in memory. Preferably, the overall time allocated to the learning phase is negligible compared to the total array programming time, such as due to a small size of the sample.

The response of the bits to the programming operation may then be analyzed, such as by a processor (step 103). The analysis may determine the one operating pulse that singly changes electrical, physical and/or mechanical properties of the bits a predefined amount (step 104). For example, in the programming operation, the processor may determine the programming pulse that singly increases the threshold voltages of the bits a predefined amount (step 105). In an erasing operation, the processor may determine an erasing pulse that singly lowers the threshold voltages of the bits a predefined amount (step 106).

Threshold voltage of non-volatile memory cells is just one example of electrical, physical and/or mechanical properties that may be analyzed in the learning phase. Another examples include piezoelectric and magnetoresistive properties of ferroelectric or ferromagnetic materials. For example, magnetic memory devices, such as magnetic random access memory devices, may include ferromagnetic layers separated by a non-magnetic layer. Information is stored as directions of magnetization vectors in magnetic layers. Magnetic vectors in one magnetic layer, for example, may be magnetically fixed or pinned, while the magnetization direction of the other magnetic layer may be free to switch between the same and opposite directions as information, referred to as "parallel" and "anti-parallel" states, respectively. In response to parallel and anti-parallel states, the magnetic memory device represents two different resistances. The resistance indicates minimum and maximum values when the magnetization vectors of two magnetic layers point in substantially the same and opposite directions, respectively. Accordingly, the change in the direction of the magnetization vectors or the change in the resistance are other examples of electrical, physical and/or mechanical properties that may be analyzed in the learning phase of the present invention.

The operating pulse, which has been determined as a function of the response of the electrical, physical and/or mechanical property (e.g., threshold voltage) of the bits, preferably incorporates the influence of effects or phenomena, such as but not limited to, ambient temperature, cell critical dimensions, array architecture, and others.

The rest of the array (or some portion thereof) may then be operated on (e.g., programmed or erased) with one further operating pulse whose voltage values are that of the operating pulse that has been determined in step 104 as a function of the response of the threshold voltages of the bits (step 107). Alternatively, the rest of the array (or some portion thereof) may then be operated on (e.g., programmed or erased) with one further operating pulse whose voltage values are that of the operating pulse that has been determined in step 104, modified by a tolerance (step 108). Utilization of this operating pulse (optionally, ±some delta) as the starting point for operating (e.g., programming or erasing) on the rest of the array (or some portion thereof), may compensate for the varying effects mentioned above, such as but not limited to, ambient temperature, cell critical dimensions, array architecture, and others.

After applying the further operating pulse, the threshold voltage levels of the bits may be verified (step 109) to determine if the threshold voltage levels have reached a predefined level (step 110). If the threshold voltage levels have reached the predefined level for programming or erase, the operation method ends. If the threshold voltage levels of a certain amount of bits have not yet reached the predefined level for programming or erase, then one or more operating pulses of the same value, or alternatively a different value, may be applied to those bits or collectively to the bits of the array (step 111). The procedure may then continue until all of the bits (or a predetermined number of bits) have passed the verification step.

Figure 4:
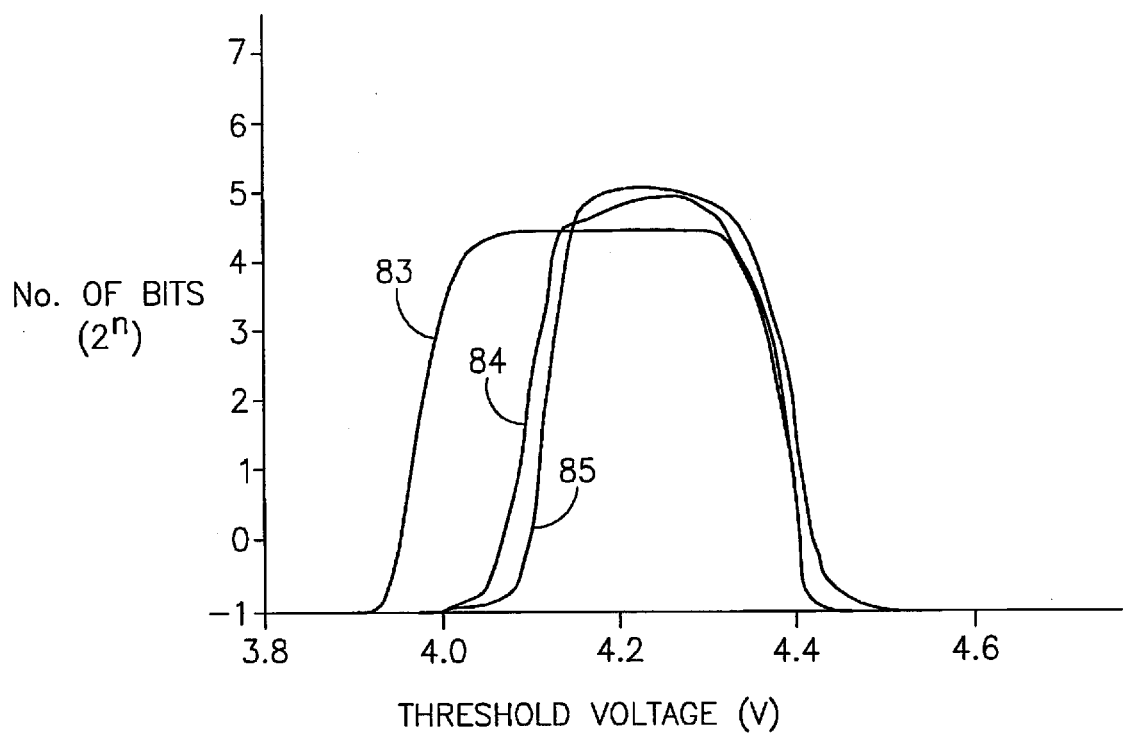
FIG. 4 is a simplified graph comparing the distribution of the threshold voltages of the cells of the entire array, respectively after the application of a single programming pulse, after a plurality of stepped programming pulses, and after a single programming pulse plus an additional supplementary programming pulse in accordance with a preferred embodiment of the present invention.

Reference is now made to FIG. 4, which illustrates a simplified graph comparing the distribution of the threshold voltages of the cells of the entire array after different applications of programming pulses, showing the number of bits (2n) versus the threshold voltage in volts. Curve 83 is the distribution of the threshold voltages of the cells of the entire array after application of a single programming pulse. The distribution is relatively wide. Curve 84 is the distribution of the threshold voltages of the cells of the entire array after a plurality of stepped programming pulses. The distribution is relatively narrow. Curve 85 is the distribution of the threshold voltages of the cells of the entire array after a single programming pulse (determined during the learning phase, as described hereinabove) plus an additional supplementary programming pulse, in accordance with a preferred embodiment of the present invention. It is seen by comparing curves 84 and 85 that the final distributions of the threshold voltages are very similar. Thus, a stepped programming algorithm for the entire array may be replaced by a single programming pulse or a single pulse plus an additional pulse with virtually the same results, thereby significantly improving programming speed.

It is noted that the majority of the array cells may be fully programmed after the first programming pulse. Only a small distribution may require one higher programming pulse and a negligible amount of cells may require even higher pulses. It may be possible to achieve one pulse programming and obtain high writing speeds, with the method of the invention.

It will be appreciated by persons skilled in the art that the present invention is not limited by what has been particularly shown and described herein above. Rather the scope of the invention is defined by the claims that follow:

What is claimed is:

1. A method for operating bits of memory cells in a memory array, the method comprising:

applying operating pulses to bits of a sample of memory cells;

determining a response of at least one of an electrical, physical and mechanical property of said bits to said operating pulses; and applying at least one further operating pulse to the rest of said array, said at least one further operating pulse being a function of said response.

2. The method according to claim 1 wherein said determining comprises determining an operating pulse that singly changes said at least one of an electrical, physical and mechanical property of said bits a predefined amount.

3. The method according to claim 2 wherein said determining comprises determining a programming pulse that singly increases said at least one of an electrical, physical and mechanical property of said bits a predefined amount.

4. The method according to claim 1 wherein said determining comprises determining an erasing pulse that singly lowers said at least one of an electrical, physical and mechanical property of said bits a predefined amount.

5. The method according to claim 2 wherein said applying said at least one further operating pulse comprises applying said operating pulse that singly changes said at least one of an electrical, physical and mechanical property of said bits said predefined amount.

6. The method according to claim 2 wherein said applying said at least one further operating pulse comprises applying said operating pulse, modified by a tolerance, that singly changes said at least one of an electrical, physical and mechanical property of said bits said predefined amount.

7. The method according to claim 1 and further comprising, after applying said at least one further operating pulse to the rest of said array, verify said at least one of an electrical, physical and mechanical property of bits of said array to determine if said at least one of an electrical, physical and mechanical property has reached a predefined level.

8. The method according to claim 7 and further comprising, if said at least one of an electrical, physical and mechanical property of at least a portion of the bits has not yet reached said predefined level, applying at least one more operating pulse to said at least a portion of the bits.

9. The method according to claim 1 wherein said determining said response of at least one of an electrical, physical and mechanical property comprises determining a threshold voltage level.

\* \* \* \* \*